United States Patent
Ha et al.

(10) Patent No.: US 12,412,624 B2
(45) Date of Patent: Sep. 9, 2025

(54) ULTRA-LOW-VOLTAGE STATIC RANDOM ACCESS MEMORY (SRAM) CELL FOR ELIMINATING HALF-SELECT DISTURBANCE UNDER BIT INTERLEAVING STRUCTURE

(71) Applicant: SHANGHAITECH UNIVERSITY, Shanghai (CN)

(72) Inventors: Yajun Ha, Shanghai (CN); Yifei Li, Shanghai (CN); Jian Chen, Shanghai (CN); Hongyu Chen, Shanghai (CN)

(73) Assignee: SHANGHAITECH UNIVERSITY, Shanghai (CN)

( * ) Notice: Subject to any disclaimer, the term of this patent is extended or adjusted under 35 U.S.C. 154(b) by 170 days.

(21) Appl. No.: 18/233,350

(22) Filed: Aug. 14, 2023

(65) Prior Publication Data

US 2024/0212748 A1    Jun. 27, 2024

Related U.S. Application Data

(63) Continuation of application No. PCT/CN2023/082987, filed on Mar. 22, 2023.

(30) Foreign Application Priority Data

Dec. 26, 2022    (CN) .......................... 202211671185.X

(51) Int. Cl.
    *G11C 11/419*    (2006.01)
(52) U.S. Cl.
    CPC .................. *G11C 11/419* (2013.01)
(58) Field of Classification Search
    CPC ...................................................... G11C 11/419
    (Continued)

(56) References Cited

U.S. PATENT DOCUMENTS

2002/0024049 A1* 2/2002 Nii .......................... H10B 10/12
                                                      257/E27.099
2005/0232058 A1* 10/2005 Yabe ..................... G11C 11/412
                                                      365/230.03

(Continued)

FOREIGN PATENT DOCUMENTS

| CN | 104409095 A | 3/2015 |
|---|---|---|
| CN | 107886986 A | 4/2018 |

(Continued)

OTHER PUBLICATIONS

Yi-Wei Chiu, et al., 40 nm Bit-Interleaving 12T Subthreshold SRAM With Data-Aware Write-Assist, IEEE Transactions on Circuits and Systems—I: Regular Papers, 2014, pp. 2578-2585, vol. 61 No. 9.

Kyungho Shin, et al., Half-Select Free and Bit-Line Sharing 9T SRAM for Reliable Supply Voltage Scaling, IEEE Transactions on Circuits and Systems—I: Regular Papers, 2017, pp. 1-13.

Yajuan He, et al., A Half-Select Disturb-Free 11T SRAM Cell With Built-In Write/Read-Assist Scheme for Ultralow-Voltage Operations, IEEE Transactions on Very Large Scale Integration (VLSI) Systems, 2019, pp. 2344-2353, vol. 27 No. 10.

(Continued)

*Primary Examiner* — Amir Zarabian
*Assistant Examiner* — Daniel J King
(74) *Attorney, Agent, or Firm* — Bayramoglu Law Offices LLC

(57) ABSTRACT

An ultra-low-voltage static random access memory (SRAM) cell for eliminating half-select-disturbance under a bit interleaving structure includes a cross-coupled inverter pair, two N-type write transistors NM1 and NM2, two P-type write transistors PM1 and PM2, and two N-type transistors NM3 and NM4, where the two N-type transistors NM3 and NM4 form a readout path. The present disclosure can be applied to applications with a storage requirement at an ultra-low voltage, especially applications with certain requirements for an access speed and reliability of an SRAM at a low voltage. Compared with other different SRAM cells, the ultra-low-voltage SRAM cell can achieve higher read and write working frequencies with similar energy consumptions.

8 Claims, 5 Drawing Sheets

(58) Field of Classification Search
USPC .......................................................... 365/154
See application file for complete search history.

(56) References Cited

U.S. PATENT DOCUMENTS

| | | | |
|---|---|---|---|
| 2008/0159051 A1* | 7/2008 | Kato | G11C 11/412 |
| | | | 365/230.01 |
| 2009/0059705 A1 | 3/2009 | Wong | |

FOREIGN PATENT DOCUMENTS

| | | |
|---|---|---|
| CN | 109003639 A | 12/2018 |
| CN | 114694709 A | 7/2022 |

OTHER PUBLICATIONS

Tae Woo Oh, et al., Power-Gated 9T SRAM Cell for Low-Energy Operation, IEEE Transactions on Very Large Scale Integration (VLSI) Systems, 2017, pp. 1-5.

Jiacong Sun, et al., An Ultra-Low-Voltage Bit-Interleaved Synthesizable 13T SRAM Circuit, IEEE Journal of Solid-State Circuits, 2022, pp. 3477-3489, vol. 57 No. 11.

M. Sultan M. Siddiqui, et al., A 16-kb 9T Ultralow-Voltage SRAM With Column-Based Split Cell-VSS, Data-Aware Write-Assist, and Enhanced Read Sensing Margin in 28-nm FDSOI, IEEE Transactions on Very Large Scale Integration (VLSI) Systems, 2021, pp. 1707-1719, vol. 29 No. 10.

* cited by examiner

ULTRA-LOW-VOLTAGE STATIC RANDOM ACCESS MEMORY (SRAM) CELL FOR ELIMINATING HALF-SELECT DISTURBANCE UNDER BIT INTERLEAVING STRUCTURE

CROSS REFERENCE TO THE RELATED APPLICATIONS

This application is the continuation application of International Application No. PCT/CN2023/082987, filed on Mar. 22, 2023, which is based upon and claims priority to Chinese Patent Application No. 202211671185.X, filed on Dec. 26, 2022, the entire contents of which are incorporated herein by reference.

TECHNICAL FIELD

The present disclosure relates to an ultra-low-voltage static random access memory (SRAM) cell for eliminating half-select-disturbance under a bit interleaving structure, and belongs to the technical field of electronic component design.

BACKGROUND

The widespread application of wireless sensors, implantable biomedical devices, and small handheld devices imposes an increasing requirement for low power consumption. One of the most effective ways to achieve ultra-low energy consumption is to reduce a supply voltage, so there is an increasing demand for an ultra-low-voltage SRAM. However, a probability that a soft error occurs at a low voltage is also increasing, and it is crucial to use a bit interleaving structure to effectively mitigate the soft error for the ultra-low-voltage SRAM. However, in the bit interleaving structure, there may be write half-select-disturbance that leads to unstable operation, which poses a key challenge for achieving a fast write operation at an ultra-low voltage.

Many ultra-low-voltage SRAM designs with different cell structures have been proposed attempting to avoid the half-select-disturbance, such as DAWA12T[1], BLS9T[2], SPG11T[3], PG9T[4], and SCM13T[5]. In [1], [2], and [4], an SRAM cell can completely eliminate the write half-select-disturbance by using a write word line (WWL) structure with rows and columns crossed. However, this structure relies on two N-channel metal oxide semiconductors (NMOSs) connected in series to perform a write operation, which significantly degrades a write capability of the SRAM at the ultra-low voltage. In [3], a feedback loop of an inverter is improved and a virtual ground is introduced, such that half-select-disturbance is effectively eliminated and a high write capability is achieved. However, this structure has low resistance to noise and other disturbance. At the ultra-low voltage, noise with a small amplitude can cause stored data to be rewritten. In [5], a standardized SRAM cell with pure digital input and output and capable of eliminating the half-select-disturbance is proposed, but its read and write access speeds are severely reduced at the low voltage. In [6], a ground wire separation technology is adopted to improve a noise margin for the half-select-disturbance, which results in complex power control logic and cannot completely eliminate the half-select-disturbance.

CITED REFERENCES

[1] Y.-W. Chiu et al., "40 nm Bit-Interleaving 12T Subthreshold SRAM With Data-Aware Write-Assist," IEEE Transactions on Circuits and Systems I: Regular Papers, vol. 61, no. 9, pp. 2578-2585, September 2014.

[2] K. Shin, W. Choi and J. Park, "Half-Select Free and Bit-Line Sharing 9T SRAM for Reliable Supply Voltage Scaling," IEEE Transactions on Circuits and Systems I: Regular Papers, vol. 64, no. 8, pp. 2036-2048, August 2017.

[3] Y. He, J. Zhang, X. Wu, X. Si, S. Zhen and B. Zhang, "A Half-Select Disturb-Free 11T SRAM Cell With Built-In Write/Read-Assist Scheme for Ultralow-Voltage Operations," IEEE Transactions on Very Large Scale Integration (VLSI) Systems, vol. 27, no. 10, pp. 2344-2353, October 2019.

[4] T. W. Oh, H. Jeong, K. Kang, J. Park, Y. Yang and S.-O. Jung, "Power-Gated 9T SRAM Cell for Low-Energy Operation," IEEE Transactions on Very Large Scale Integration (VLSI) Systems, vol. 25, no. 3, pp. 1183-1187, March 2017.

[5] J. Sun, H. Guo, G. Li and H. Jiao, "An Ultra-Low-Voltage Bit-Interleaved Synthesizable 13T SRAM Circuit," IEEE Journal of Solid-State Circuits, vol. 57, no. 11, pp. 3477-3489, November 2022.

[6] M. S. M. Siddiqui, Z. C. Lee and T. T.-H. Kim, "A 16-kb 9T Ultralow-Voltage SRAM With Column-Based Split Cell-VSS, Data-Aware Write-Assist, and Enhanced Read Sensing Margin in 28-nm FDSOI," IEEE Transactions on Very Large Scale Integration (VLSI) Systems, vol. 29, no. 10, pp. 1707-1719, October 2021.

SUMMARY

The present disclosure is intended to resolve a following technical problem: It is crucial to use a bit interleaving structure to effectively mitigate a soft error for an ultra-low-voltage SRAM. However, in the bit interleaving structure, there may be write half-select-disturbance that leads to unstable operation, which poses a key challenge for achieving a fast write operation at an ultra-low voltage.

In order to resolve the above technical problem, the technical solutions of the present disclosure provide an ultra-low-voltage SRAM cell for eliminating half-select-disturbance under a bit interleaving structure, including a cross-coupled inverter pair, two N-type write transistors NM1 and NM2, two P-type write transistors PM1 and PM2, and two N-type transistors NM3 and NM4, where the two N-type transistors NM3 and NM4 form a readout path, where the two N-type write transistors NM1 and NM2 are controlled by write word lines WWLNB and WWLN respectively, such that one of the two N-type write transistors NM1 and NM2 and a shared P-channel metal oxide semiconductor (PMOS) footer constitute a series-connected PMOS pair;

the two P-type write transistors PM1 and PM2 are controlled by write word lines WWLPB and WWLP respectively, such that one of the two P-type write transistors PM1 and PM2 and an NMOS header constitute a series-connected NMOS pair;

the NMOS footer and the PMOS header are respectively controlled by row-based signals WLPC and WLNC to be connected to V_GND and V_VDD;

the N-type write transistor NM1 and the P-type write transistor PM1 are connected to one terminal of the cross-coupled inverter pair through an endpoint QB, and the N-type write transistor NM2 and the P-type write transistor PM2 are connected to the other terminal of the cross-coupled inverter pair through an endpoint Q; and the endpoint Q and a read word line (RWL) jointly determine data of a read bit line led from the readout path;

in a write state, a number 1 is directly written into the endpoint Q through the series-connected PMOS pair, and a number 0 is written into the endpoint QB through the series-connected NMOS pair and the cross-coupled inverter pair; and the number 1 is directly written into the endpoint QB through the series-connected PMOS pair, and the number 0 is written into the endpoint Q through the series-connected NMOS pair and the cross-coupled inverter pair; and in a read state, a number stored on the endpoint Q is read to the read bit line through the readout path by using the RWL.

Preferably, first terminals of the two N-type write transistors NM1 and NM2 are connected to the write word lines WWLNB and WWLN respectively, second terminals of the two N-type write transistors NM1 and NM2 are connected to second terminals of the two P-type write transistors PM1 and PM2 respectively, and third terminals of the two N-type write transistors NM1 and NM2 are controlled by the write word lines WWLNB and WWLN and are connected to the V_GND through the shared PMOS footer.

Preferably, first terminals of the two P-type write transistors PM1 and PM2 are connected to the write word lines WWLPB and WWLP respectively, and third terminals of the two P-type write transistors PM1 and PM2 are controlled by the write word lines WWLPB and WWLP and are connected to the V_VDD through the shared NMOS header.

Preferably, the one terminal of the cross-coupled inverter pair is connected to the second terminals of the P-type write transistor PM1 and the N-type write transistor NM1 and is defined as the endpoint QB; and the other terminal of the cross-coupled inverter pair is connected to the second terminals of the P-type write transistor PM2 and the N-type write transistor NM2 and is defined as the endpoint Q.

Preferably, in the readout path, a first terminal of the N-type transistor NM3 is connected to the RWL, a second terminal of the N-type transistor NM3 is connected to a second terminal of the N-type transistor NM4, and a third terminal of the N-type transistor NM3 is connected to the read bit line; and a first terminal of the N-type transistor NM4 is connected to the endpoint Q, and a third terminal of the N-type transistor NM4 is connected to the V_GND.

Preferably, the bit interleaving structure includes a number N of the ultra-low-voltage SRAM cells connected in series, and all the ultra-low-voltage SRAM cells share a same NMOS footer and PMOS header.

Preferably, there are M rows of bit interleaving structures, bit interleaving structures of different rows share different NMOS footers and PMOS headers, and row-based signals WLPC and WLNC of adjacent rows are opposite, where the WLPC, the WLNC, and the RWL are row-based signals, and the write word lines WWLPB, WWLP, WWLNB, and WWLN, and the read bit line are half-based signals; and for a row half-select cell, a shared PMOS header and NMOS footer are turned on, and the N-type write transistors NM1 and NM2 and the P-type write transistors PM1 and PM2 are turned off by the half-based write word lines WWLPB, WWLP, WWLNB, and WWLN; and for a column half-select cell, a corresponding write transistor is turned on by a corresponding half-based WWL, and the shared PMOS header and NMOS footer are turned off by the row-based signals WLPC and WLNC.

Preferably, an SRAM array including a number MXN of the ultra-low-voltage SRAM cells and a precharge module of the SRAM array are powered by a low voltage, and a peripheral circuit of the SRAM array is powered by a high voltage.

Compared with the prior art, the present disclosure has following advantages:

(1) A fully decoupled topology proposed in the present disclosure has dedicated read and write terminals, which can achieve a high write margin during operation.

(2) The present disclosure provides a differential data-aware write path, which can effectively improve a write capability and reduce a write latency by turning on different paths based on different written data.

(3) The present disclosure provides a speed-optimized dual power supply method. The supply voltage of the peripheral circuit can be appropriately increased to effectively reduce a peripheral delay, and reduce a leakage energy consumption generated by a single operation, thereby maintaining overall energy efficiency of the array.

The present disclosure can be applied to applications with a storage requirement at an ultra-low voltage, especially applications with certain requirements for an access speed and reliability of an SRAM at a low voltage. Compared with other different SRAM cells, the present disclosure can achieve higher read and write working frequencies with similar energy consumptions.

DETAILED DESCRIPTION OF THE EMBODIMENTS

The present disclosure will be further described below with reference to specific embodiments. It should be understood that these embodiments are only intended to describe the present disclosure, rather than to limit the scope of the present disclosure. In addition, it should be understood that various changes and modifications may be made on the present disclosure by those skilled in the art after reading the content of the present disclosure, and these equivalent forms also fall within the scope defined by the appended claims of the present disclosure.

Figure 1:
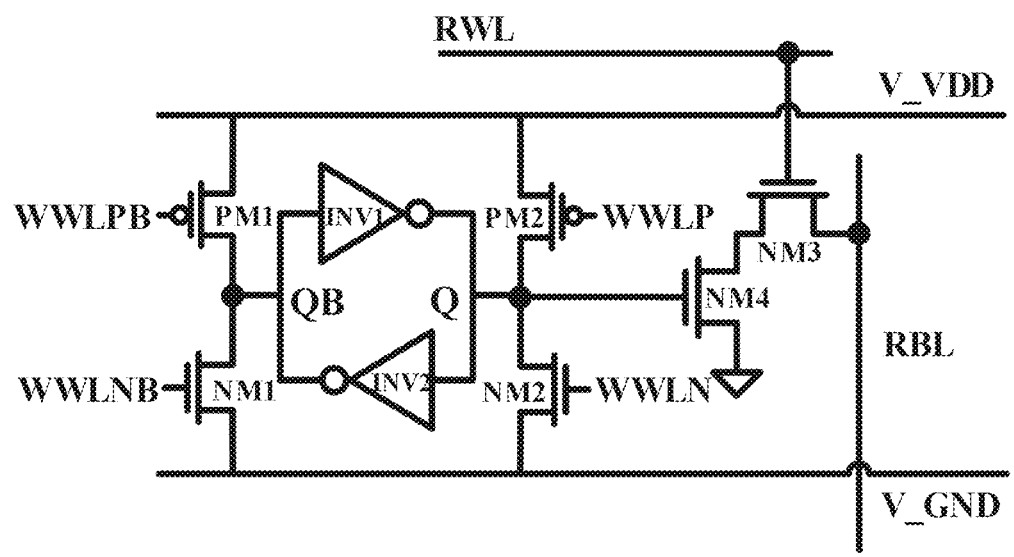
FIG. 1 shows an ultra-low-voltage (10T) SRAM cell for eliminating half-select-disturbance under a bit interleaving structure according to the present disclosure.

As shown in FIG. 1, an ultra-low-voltage (10T) SRAM cell for eliminating half-select interference under a bit interleaving structure in the embodiments includes an inverter pair composed of INV1 and INV2, two N-type write transistors NM1 and NM2, two P-type write transistors PM1 and PM2, and two N-type transistors NM3 and NM4, where the two N-type transistors NM3 and NM4 form a readout path.

First terminals of the two N-type write transistors NM1 and NM2 are connected to write word lines WWLNB and WWLN respectively, second terminals of the two N-type write transistors NM1 and NM2 are connected to second terminals of the two P-type write transistors PM1 and PM2 respectively, and third terminals of the two N-type write transistors NM1 and NM2 are controlled by the write word lines WWLNB and WWLN and are connected to V_GND through a shared PMOS footer.

First terminals of the two P-type write transistors PM1 and PM2 are connected to write word lines WWLPB and WWLP respectively, and third terminals of the two P-type write transistors PM1 and PM2 are controlled by the write word lines WWLPB and WWLP and are connected to V_VDD through a shared NMOS header.

One terminal of the cross-coupled inverter pair is connected to the second terminals of the P-type write transistor PM1 and the N-type write transistor NM1 and is defined as endpoint QB; and the other terminal of the cross-coupled inverter pair is connected to the second terminals of the P-type write transistor PM2 and the N-type write transistor NM2 and is defined as endpoint Q.

The readout path is formed by connecting the N-type transistors NM3 and NM4 in series. A first terminal of the N-type transistor NM3 is connected to an RWL, a second terminal of the N-type transistor NM3 is connected to a second terminal of the N-type transistor NM4, and a third terminal of the N-type transistor NM3 is connected to a read bit line. A first terminal of the N-type transistor NM4 is connected to the endpoint Q, and a third terminal of the N-type transistor NM4 is connected to the V_GND. The endpoint Q and the RWL jointly determine data of the read bit line.

The NMOS footer and the PMOS header are respectively controlled by row-based signals WLPC and WLNC.

A truth value of each terminal of the above 10T SRAM cell in read, written, and held states is shown in a following table.

|  | Memory Operations | | | |
| --- | --- | --- | --- | --- |
|  | Write "0" | Write "1" | Read | Hold |
| WLPC | GND | GND | VDD | VDD |
| WLNC | VDD | VDD | GND | GND |
| WWLPB | GND | VDD | VDD | VDD |
| WWLP | VDD | GND | VDD | VDD |
| WWLNB | GND | VDD | GND | GND |
| WWLN | VDD | GND | GND | GND |
| RWL | GND | GND | VDD | GND |

A corresponding row and column based relationship of each terminal signal is shown in a following table.

| Row-based | WLPC; WLNC; RWL |
| --- | --- |
| Half-based | WWLPB; WWLP; WWLNB; WWLN; RBL |

Figure 2:
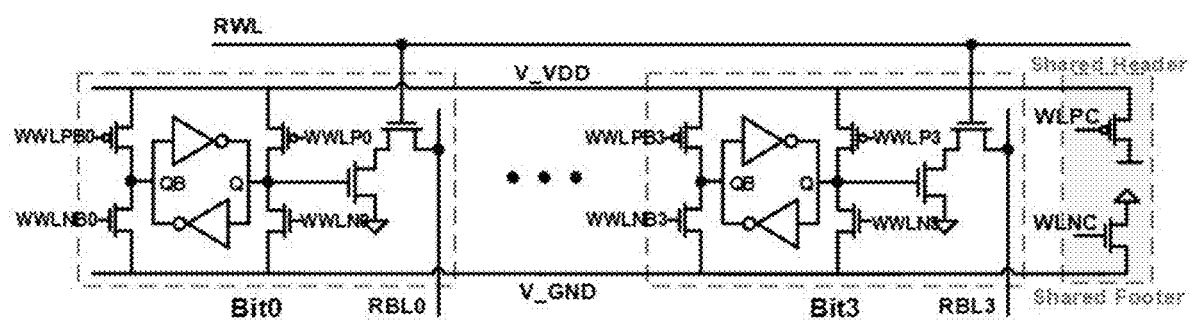
FIG. 2 shows a 4-bit bit interleaving structure according to an embodiment.

A 4-bit bit interleaving structure based on the above ultra-low-voltage 10T SRAM cell is shown in FIG. 2, which is constituted by connecting four ultra-low-voltage 10T SRAM cells in series. For case of description and understanding, the four ultra-low-voltage 10T SRAM cells are numbered Bit0-Bit3 from left to right. The four ultra-low-voltage 10T SRAM cell share a same NMOS footer and PMOS header to eliminate half-select interference, the row-shared signals WLPC and WLNC are enabled to control the NMOS footer and the PMOS header. In FIG. 2, a differential write terminal of the bit interleaving structure is controlled by column-shared word line signals WWLPB, WWLP, WWLNB, and WWLN. For ease of description and understanding, the column shared word line signals are sequentially numbered WWLPB0-WWLPB3, WWLP0-WWLP3, WWLNB0-WWLNB3, and WWLN0-WWLN3.

Figure 3:
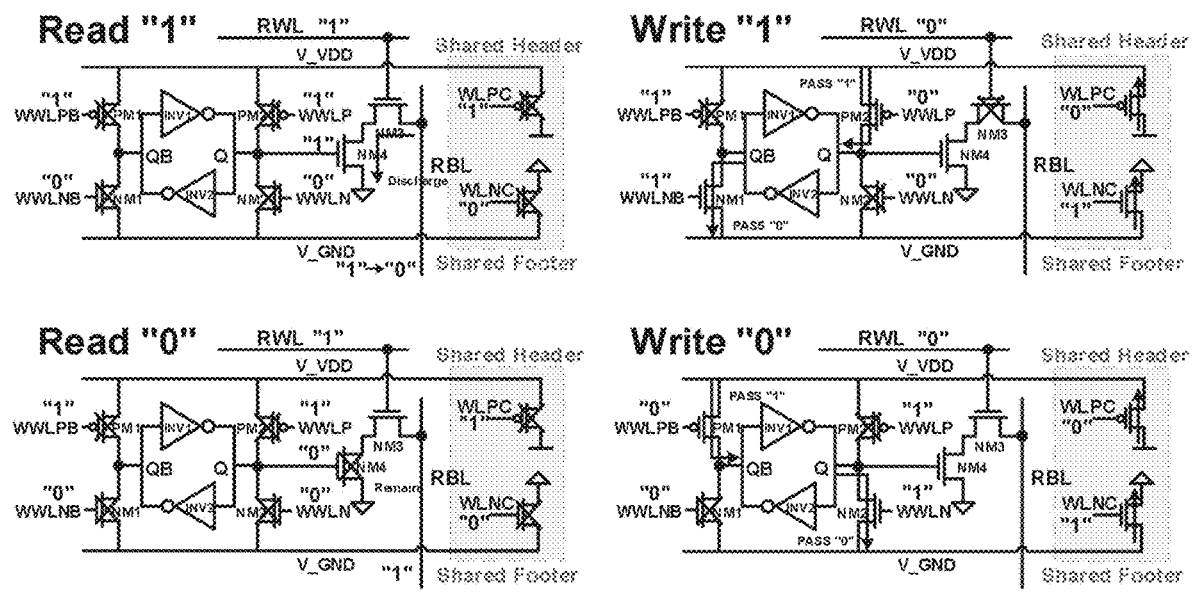
FIG. 3 shows transistor operating states of an SRAM cell under different read and write states according to the present disclosure.

FIG. 3 shows the ultra-low-voltage 10T SRAM cell with shared NMOS footer and PMOS header under different read and write states. FIG. 3 focuses on the operation of the read and write terminals and the header and footer and does not focus on the inverter pair composed of INV1 and INV2. As shown in FIG. 3, for a read operation of a selected ultra-low-voltage 10T SRAM cell, a row-shared RWL is selected to enable the read terminal RBL to remain "1" or discharge to "0". With a decoupling function, the read operation does not cause the half-select interference. For a write operation, the row-shared signals WLPC and WLNC are enabled to turn on the NMOS footer and the PMOS header. When the "1" is written, the P-type write transistor PM2 and the N-type write transistor NM1 are turned on by the column-shared signals WWLP and WWLNB. In this case, a series-connected PMOS pair (the PMOS header and the P-type write transistor PM2) is configured to transmit a lossless "1" to the endpoint Q. After the "1" is inverted by the inverter pair, a series-connected NMOS pair (the NMOS footer and the N-type write transistor NM1) enables the "0" to be transmitted to the endpoint QB, and the "1" is stored at the endpoint Q. When the "0" is written, similar analysis may also be performed. In this case, a series-connected PMOS pair (the PMOS header and the P-type write transistor PM1) is configured to transmit the lossless "1" to the endpoint QB. After the "1" is inverted by the inverter pair, a series-connected NMOS pair (the NMOS footer and the N-type write transistor NM2) enables the "0" to be transmitted to the endpoint Q, and the "0" is stored at the endpoint Q.

Figure 4:
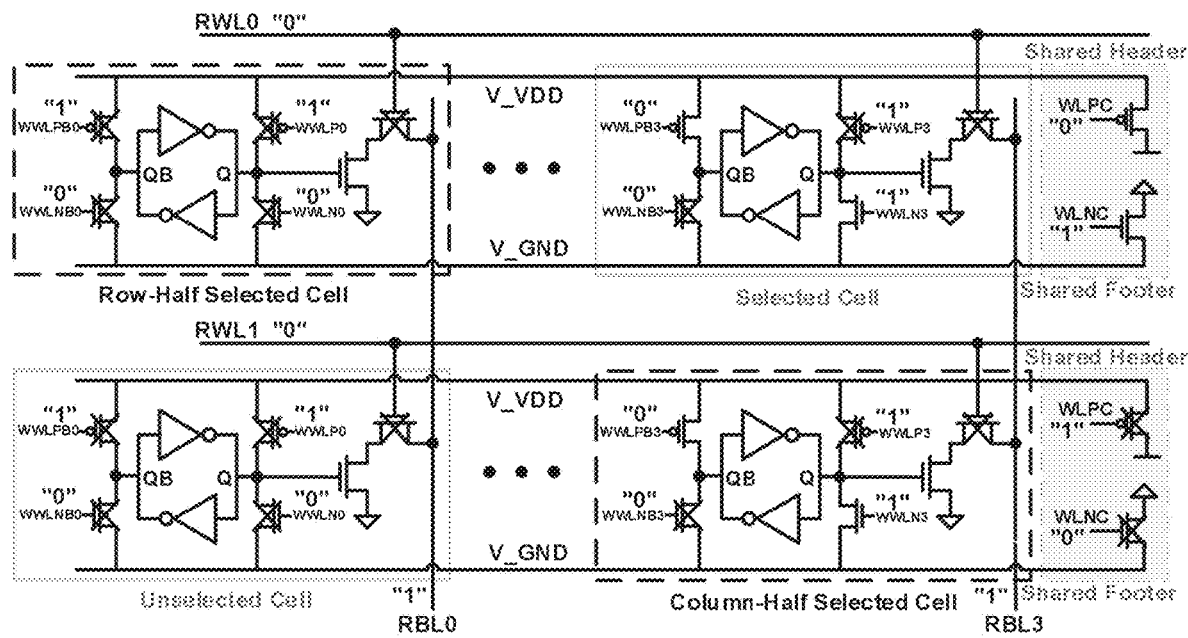
FIG. 4 shows a principle of eliminating write half-select-disturbance by an SRAM cell (taking an operation of writing a "0" as an example) according to the present disclosure.

For ease of description and understanding, the column shared word line signals are sequentially numbered WWLPB0-WWLPB3, WWLP0-WWLP3, WWLNB0-WWLNB3, and WWLN0-WWLN3. As shown in FIG. 4, row-shared signals WLPC and WLNC of the NMOS footer and the PMOS header that are located in adjacent rows are opposite to the adjacent rows. For a row half-select cell (cell in an upper left corner), although the shared PMOS header and NMOS hooter are turned on, the four write access transistors are turned off by the column-shared write word lines WWLPB0, WWLP0, WWLNB0, and WWLN0. Therefore, no interference is caused. For a column half-select unit (cell in a bottom right corner), two write access transistors are turned off by the column-shared write word lines WWLP3 and WWLNB3, although the two write access transistors are turned on by the column-shared signals WWLPB3 and WWLN3, the shared PMOS header and NMOS footer are turned off by the row-shared signals WLPC and WLNC. Therefore, there is no write path that can cause interference.

Figure 5:
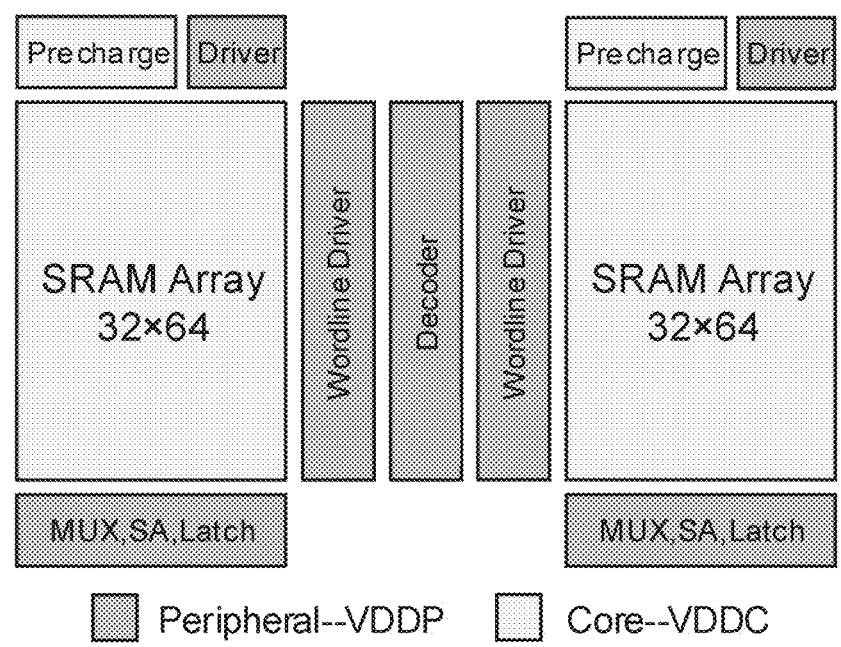
FIG. 5 shows a power supply mode of an integrated SRAM array.

As shown in FIG. 5, for an integrated SRAM array, a high supply voltage is used for a peripheral circuit, including a driver module, a WordlineDriver module, a decoder module, selection output module MUX, a sensitive amplifier (SA), an output latch, and the like. A low voltage is used for a core circuit, including the SRAM array, a precharge module, and the like. According to such a dual power supply method, the supply voltage of the peripheral circuit is appropriately increased, such that a peripheral delay can be effectively reduced, and a leakage energy consumption generated by a single operation is reduced. Therefore, an overall operating speed of the array is optimized, and overall energy efficiency of the array is maintained.

List of Components in FIG. 1:
 INV1—Abbreviation for inverter No. 1 in SRAM cell
 INV2—Abbreviation for inverter No. 2 in SRAM cell
 RBL—Abbreviation for read terminal (read bit line) in SRAM cell List of Components in FIG. 2:
 WWLP0—Abbreviation for write word line positive No. 0
 WWLN0—Abbreviation for write word line negative No. 0
 WWLPB3—Abbreviation for write word line positive bar No. 3
 WWLNB3—Abbreviation for write word line negative bar No. 3
 WWLP3—Abbreviation for write word line positive No. 3
 WWLNS—NOT WWLNS, should be WWLN3, abbreviation for write word line negative No.
 Bit0 Represents the 0th bitcell in a 4-bit bit interleaving structure. Abbreviated as Bit0
 Bit3 Represents the 3th bitcell in a 4-bit bit interleaving structure. Abbreviated as Bit3

List of Components in FIG. 3:
 INV1—Abbreviation for inverter No. 1 in SRAM cell
 INV2—Abbreviation for inverter No. 2 in SRAM cell
 RBL—Abbreviation for read terminal (read bitline) in SRAM cell List of Components in FIG. 4:
 WWLPB0—Abbreviation for write wordline positive bar No. 0 in SRAM array
 WWLNB0—Abbreviation for write wordline negative bar No. 0 in SRAM array
 WWLP0—Abbreviation for write wordline positive No. 0 in SRAM array
 WWLN0—Abbreviation for write wordline negative No. 0 in SRAM array
 WWLPB3—Abbreviation for write wordline positive bar No. 3 in SRAM array
 WWLNB3—Abbreviation for write wordline negative bar No. 3 in SRAM array
 WWLP3—Abbreviation for write wordline positive No. 3 in SRAM array
 WWLN3—Abbreviation for write wordline negative No. 3 in SRAM array

What is claimed is:

1. An ultra-low-voltage static random access memory (SRAM) cell for eliminating a half-select-disturbance under a bit interleaving structure, comprising a cross-coupled inverter pair, two N-type write transistors NM1 and NM2, two P-type write transistors PM1 and PM2, and two N-type transistors NM3 and NM4, wherein the two N-type transistors NM3 and NM4 form a readout path, wherein
 the two N-type write transistors NM1 and NM2 are controlled by write word lines WWLNB and WWLN respectively, such that one of the two N-type write transistors NM1 and NM2 and a shared P-channel metal oxide semiconductor (PMOS) footer constitute a series-connected PMOS pair;
 the two P-type write transistors PM1 and PM2 are controlled by write word lines WWLPB and WWLP respectively, such that one of the two P-type write transistors PM1 and PM2 and a shared N-channel metal oxide semiconductor (NMOS) header constitute a series-connected NMOS pair;
 an NMOS footer and a PMOS header are respectively controlled by row-based signals WLPC and WLNC connected to a ground voltage (V_GND) and a drain voltage (V_VDD);
 the N-type write transistor NM1 and the P-type write transistor PM1 are connected to a first terminal of the cross-coupled inverter pair through an endpoint QB, and the N-type write transistor NM2 and the P-type write transistor PM2 are connected to a second terminal of the cross-coupled inverter pair through an endpoint Q; and the endpoint Q and a read word line (RWL) jointly determine data of a read bit line led from the readout path;
 in a write state, a number 1 is directly written into the endpoint Q through the series-connected PMOS pair, and a number 0 is written into the endpoint QB through the series-connected NMOS pair and the cross-coupled inverter pair; and the number 1 is directly written into the endpoint QB through the series-connected PMOS pair, and the number 0 is written into the endpoint Q through the series-connected NMOS pair and the cross-coupled inverter pair; and
 in a read state, a number stored on the endpoint Q is read to the read bit line through the readout path by using the RWL.

2. The ultra-low-voltage SRAM cell for eliminating the half-select-disturbance under the bit interleaving structure according to claim 1, wherein first terminals of the two N-type write transistors NM1 and NM2 are connected to the write word lines WWLNB and WWLN respectively, second terminals of the two N-type write transistors NM1 and NM2 are connected to second terminals of the two P-type write transistors PM1 and PM2 respectively, and third terminals of the two N-type write transistors NM1 and NM2 are controlled by the write word lines WWLNB and WWLN and are connected to the V_GND through the shared PMOS footer.

3. The ultra-low-voltage SRAM cell for eliminating the half-select-disturbance under the bit interleaving structure according to claim 2, wherein first terminals of the two P-type write transistors PM1 and PM2 are connected to the write word lines WWLPB and WWLP respectively, and third terminals of the two P-type write transistors PM1 and PM2 are controlled by the write word lines WWLPB and WWLP and are connected to the V_VDD through the shared NMOS header.

4. The ultra-low-voltage SRAM cell for eliminating the half-select-disturbance under the bit interleaving structure according to claim 3, wherein the first terminal of the cross-coupled inverter pair is connected to the second terminals of the P-type write transistor PM1 and the N-type write transistor NM1 and is defined as the endpoint QB; and the second terminal of the cross-coupled inverter pair is connected to the second terminals of the P-type write transistor PM2 and the N-type write transistor NM2 and is defined as the endpoint Q.

5. The ultra-low-voltage SRAM cell for eliminating the half-select-disturbance under the bit interleaving structure according to claim 4, wherein in the readout path, a first terminal of the N-type transistor NM3 is connected to the RWL, a second terminal of the N-type transistor NM3 is connected to a second terminal of the N-type transistor NM4, and a third terminal of the N-type transistor NM3 is connected to the read bit line; and a first terminal of the N-type transistor NM4 is connected to the endpoint Q, and a third terminal of the N-type transistor NM4 is connected to the V_GND.

6. The ultra-low-voltage SRAM cell for eliminating the half-select-disturbance under the bit interleaving structure according to claim 1, wherein the bit interleaving structure comprises a number N of the ultra-low-voltage SRAM cells connected in series, and all the ultra-low-voltage SRAM cells share a same NMOS footer and PMOS header.

7. The ultra-low-voltage SRAM cell for eliminating the half-select-disturbance under the bit interleaving structure according to claim 6, wherein M rows of the bit interleaving structures are arranged, wherein the bit interleaving structures of different rows share different NMOS footers and PMOS headers, and the row-based signals WLPC and WLNC of adjacent rows are opposite, wherein the WLPC, the WLNC, and the RWL are row-based signals, and the write word lines WWLPB, WWLP, WWLNB, and WWLN, and the read bit line are half-based signals; and for a row half-select cell, a shared PMOS header and NMOS footer are turned on, and the N-type write transistors NM1 and NM2 and the P-type write transistors PM1 and PM2 are turned off by the half-based write word lines WWLPB, WWLP, WWLNB, and WWLN; and for a column half-select cell, a corresponding write transistor is turned on by a corresponding half-based WWL, and the shared PMOS header and NMOS footer are turned off by the row-based signals WLPC and WLNC.

8. The ultra-low-voltage SRAM cell for eliminating the half-select-disturbance under the bit interleaving structure according to claim 7, wherein an SRAM array comprising a number M×N of the ultra-low-voltage SRAM cells and a precharge module of the SRAM array are powered by a low voltage, and a peripheral circuit of the SRAM array is powered by a high voltage.

* * * * *